United States Patent
Meyer

(10) Patent No.: US 6,224,718 B1
(45) Date of Patent: May 1, 2001

(54) TARGET ASSEMBLY FOR ION BEAM SPUTTER DEPOSITION WITH MULTIPLE PADDLES EACH HAVING TARGETS ON BOTH SIDES

(75) Inventor: William A. Meyer, Fairfax, VA (US)

(73) Assignee: Veeco Instruments, Inc., Plainview, NY (US)

( * ) Notice: Subject to any disclaimer, the term of this patent is extended or adjusted under 35 U.S.C. 154(b) by 0 days.

(21) Appl. No.: 09/351,856

(22) Filed: Jul. 14, 1999

(51) Int. Cl.[7] ............................. C23C 14/34; C23C 14/46
(52) U.S. Cl. ................. 204/192.12; 204/298.04; 204/298.11; 204/298.12; 204/298.23; 204/298.27; 204/298.28; 204/192.11
(58) Field of Search ........................... 204/298.04, 298.11, 204/298.12, 298.23, 298.27, 298.28, 298.36, 192.12, 192.11, 192.34

(56) References Cited

U.S. PATENT DOCUMENTS

| | | |
|---|---|---|
| 4,142,958 | 3/1979 | Wei et al. . |
| 4,416,755 | 11/1983 | Ceasar et al. . |
| 4,560,577 | 12/1985 | Mirtich et al. . |
| 4,793,908 | 12/1988 | Scott et al. . |
| 4,923,585 | 5/1990 | Krauss et al. . |
| 5,089,104 | 2/1992 | Kanda et al. . |
| 5,178,736 | 1/1993 | Ishikawa et al. . |
| 5,240,583 | 8/1993 | Ahonen . |
| 5,454,919 | 10/1995 | Hill et al. . |
| 5,492,605 | 2/1996 | Pinarbasi . |
| 5,525,199 | 6/1996 | Scobey . |
| 5,529,971 | 6/1996 | Debley et al. . |
| 5,645,699 | 7/1997 | Sieck . |
| 5,741,404 | 4/1998 | Cathey . |
| 6,113,752 | * 9/2000 | Hollstein ............... 204/192.12 |

FOREIGN PATENT DOCUMENTS

| | | |
|---|---|---|
| 2228948 | * 9/1990 | (GB) . |
| 1-283370 | * 11/1989 | (JP) . |
| 4-107257 | * 4/1992 | (JP) . |

* cited by examiner

*Primary Examiner*—Alan Diamond
(74) *Attorney, Agent, or Firm*—Blank, Rome, Comisky & McCauley LLP

(57) ABSTRACT

An ion beam sputtering target assembly has six sputter targets arranged in pairs on three paddles and disposed upon the circumference of a circular holder. The circular holder can be rotated about its axis in such a way as to bring any one of the target pairs to be exposed to the sputtering ion beam to deposit a film on substrate. The paddle is rotated to bring a desired target in the pair into position for sputtering. An alternative embodiment is provided with an enlarged region which allows one of the target paddles to be rotated about its axis while that target paddle is in an inactive, non-sputtering rotary position.

14 Claims, 3 Drawing Sheets

TARGET ASSEMBLY FOR ION BEAM SPUTTER DEPOSITION WITH MULTIPLE PADDLES EACH HAVING TARGETS ON BOTH SIDES

BACKGROUND OF THE INVENTION

The present invention is directed to an apparatus for the deposition of thin films in a substantially vacuum environment. More particularly, the present invention is directed to an apparatus for ion sputtering of a material from a sputtering target, in which individual ions having kinetic energies of several tens of electron-volts (eV) to several tens of thousands of eV strike the target surface and knock off (sputter) target atoms, and in which the target atoms thus liberated from the target surface are collected (condensed) from the vapor phase onto a substrate in the form of a thin film. Still more particularly, the present invention is directed to an ion sputter deposition apparatus in which the sputtering ions originate from an ion beam source situated some distance away from the sputter target.

That mode of ion sputter deposition is well known in the art as ion beam sputter deposition and has several advantages over other ion sputter deposition modes, e.g., diode sputtering or magnetron sputtering. Chief among the advantages of ion beam sputter deposition is that the pressure of the background gas (mostly the same species of gas from which the ions are formed) can be much lower than in the other ion sputtering modes because the sputtering ions are generated in a highly efficient, independently powered, remote ion source. Such known sources are reviewed in "Technology and applications of broad-beam ion sources used in sputtering—Part 1: Ion source technology," H. R. Kaufman, J. J. Cuomo and J. M. E. Harper, *J. Vac. Sci. Technol.* 21(3) pp.725–736 (1982). The lower background gas pressure means that target atoms sputtered off of the target can traverse the distance from the target to the substrate substantially unimpeded by collisions with the molecules of the background gas. As a consequence, both the kinetic energy and the directionality of the sputtered atoms can be preserved upon arrival at the growing thin film on the substrate. Numerous benefits to the properties of the deposited thin film can be had by exploiting control of that kinetic energy and directionality of the depositing atom flux.

The three chief disadvantages of ion beam sputter deposition are low film deposition rate, poor thickness uniformity of the deposited film and increased possibilities for contamination of the deposited film, compared with other ion sputter deposition modes. All three disadvantages can be significantly alleviated simultaneously if a sputter target with large surface area, relative to the size of the substrate, is used. Then a large-area, high-current sputtering ion beam can be used to irradiate a large areal extent of the target surface, giving both a higher film deposition rate and more uniform thickness of the deposited film across the area of the substrate. Issues relating to film purity and contamination are dominant aspects of the present invention and are discussed below.

Also, many industrial processes require a deposition of multiple layers of different thin film materials with one ion sputter deposition machine. It is necessary to do so without exposing the substrate to the atmosphere, for example, to avoid oxidation or contamination of one layer before a subsequent layer is deposited. Therefore, the machine cannot simply be opened for the exchange of the sputtering target. Examples of heterogeneous multilayer thin film structures of commercial importance presently include spin-valve giant magneto-resistance (GMR) sensors used in magnetic disk data storage technology and multilayer dielectric (MLD) stacks used in optical technology as interference filters, laser mirrors, wave-division multiplexers, and other devices. To make such multilayers on a substrate without removal from vacuum, it is known in the art to make a target holder with multiple targets, each of which can be brought to the sputtering position, one at a time. However, when very large targets are contemplated, that can result in a bulky, cumbersome target array.

Ion beam sputter deposition of thin films from ion beam sputter targets is limited in the chemical purity of the deposited film by the possibility of the ion beam sputtering atoms into the growing film from sources other than the intended sputter target. Therefore, it is of great advantage to have the largest possible areal extent of the sputter target surface. Ideally, the sputter target would intercept all of the sputtering ions projected by the ion beam source. In reality, volume contaminant levels of $1:10^3$ to $1:10^5$ due to stray sputtering ions are sometimes achieved in present ion beam sputtering applications. In other applications, impurity levels on the order of $1:10^7$ are necessary. To achieve that, the largest possible ratio of sputter target area to intended sputtering ion beam irradiation area is also desired. Using a small irradiation area to target area ratio, the stray and uncontrolled portions of an ion beam, which can otherwise strike materials off of the target, will strike the target and not contaminate the growing film with off-target-sputtered atoms.

Another source of chemical impurity for multi-target arrays is cross-contamination of the inactive targets by sputtered material from the active target. Various shielding techniques to prevent such cross-contamination are known in the prior art, as will be described below.

A final aspect of the background technology of ion beam sputter deposition relates to the surface condition which develops on the sputter target. Typically, in the state of the art, the ion beam is incident upon the target not only at a fixed polar angle with respect to the surface normal but also at a fixed azimuthal angle. On a typical, fine-grained (0.1 to 2.0 mm) polycrystalline sputter target, sputtering at those fixed angles results in a slow (hours) evolution of increasingly severe surface roughening. Moreover, because of preferential sputtering of certain crystal planes at certain angles over other crystal planes at other angles, the surface roughing which results often takes the form of "shark-skin" texture, i.e., sharp-pointed surface protrusions which are aimed substantially in the direction of the sputtering ion beam. The time-development of directional surface structures on the target must necessarily affect both the total sputtered atom flux escaping from the target surface and the angular distribution of that sputtered flux. The total escaping sputtered flux affects the film deposition rate, and the angular distribution of that flux affects the uniformity of the deposited film across the area of the substrate.

Various developments in ion sputtering art will now be described briefly. However, it will be apparent that none of them overcomes the above-noted deficiencies of conventional ion sputtering.

U.S. Pat. No. 4,923,585 to Krauss et al teaches an ion beam sputter deposition system comprising an ion neutral source 92 which directs a beam onto each one of plurality of sputtering targets 84, 86 and 88. The sputtering targets 84, 86 and 88 positioned on a rotating carousel 82 which sequentially positions each of the sputter targets 84, 86 and 88 in alignment with the particle beam from the ion source 92. A shutter 106 isolates the deposition substrate 94 from the sputtering targets when the sputtering targets are to be cleaned. An apertured mask 108 allows selective deposition to provide electrical connections or the like. There is no teaching to shield the inactive targets from the sputtered flux from the active target (FIG. 5, col. 6, lines 63–68; col. 7, lines 1–10, line 42–43)

U.S. Pat. No. 5,492,605 to Pinarbasi teaches an ion beam sputter deposition system comprising a vacuum chamber 22 in which an ion beam source 21 is mounted, a target 23 and deposition substrate 31. An ion beam 33 provided by the ion source 21 directed at a multiple targets 23 which are provided on a rotary target support 25. The sputtered atoms 26 emitted by the target material are directed onto a deposition substrate 31 on which is formed a layer of the target material. FIG. 9 shows what might be a loosely fitting shield, not separately numbered, around the support 85 to expose the selected target 91. However, that feature is not described in the specification, and even if it were taken to be a shield, such a shield would not be effective to protect inactive targets from sputtered flux from the selected target 91 (FIGS. 2 and 9; col. 4, lines 45–68).

U.S. Pat. Nos. 4,142,958, 4,793,908 and 5,178,738 disclose an ion beam sputtering apparatus and method for fabricating multi-layer optical films, comprising (as for example in '738) multiple targets positioned on the target holder 8. The target holder 8 is generally in the shape of a cube having four faces on which targets 7a, 7b, 7c, 7d are respectively disposed. The target holder 8 is mounted on a rotary shaft 10 so as to be rotated about its axis in such way as to bring any one of the target to be exposed to the ion beam. The shape of the holder can be planar; thus, the conductor and insulator targets are mounted on the plane and shifted as needed so that ion beams are selectively irradiated to the conductor or the insulators. There is no teaching of shielding of the targets (FIG. 1, col. 4, lines 6–35 in '738).

U.S. Pat. No. 4,560,577 to Mirtich et al teaches a sputter target 62 compound of two portions mounted back-to-back, and includes a metal portion 64 and a polymer portion 66. There is no teaching of shielding (FIG. 4, col. 4, lines 10–30).

The above and other references teach various products that can be made through sputtering processes as well as the basics of sputtering, such as the gas environment and the voltage. Therefore, such matters will not be described in detail here. The disclosures of the above-cited references are hereby incorporated by reference in their entirety into the present disclosure.

SUMMARY OF THE INVENTION

An object of the present invention is to overcome the above-noted disadvantages of ion beam sputter deposition compared with other modes of ion sputter deposition, thus enabling the benefits and controllability of ion beam sputter deposition to be utilized in a wide variety of thin film deposition applications.

Another object of the present invention is to provide a pattern for a multi-target array with targets of a maximally large surface area in a minimal volume envelope.

Still another object of the present invention is to eliminate the above-noted long-time-varying target surface roughness evolution.

To achieve these and other objects, the present invention is directed to an ion beam sputtering target assembly having multiple, e.g., six, sputter targets arranged in a particularly advantageous pattern for deposition of heterogeneous multilayer thin films. The sputter targets are arrayed in pairs back-to-back on paddles, three paddles in the preferred embodiment, and each paddle is disposed upon the circumference of a circle, equally spaced. An exemplary assembly has six targets, mounted in three pairs back-to-back on the paddles, arrayed at 120° intervals around a circular holder or bracket.

A maximum number of sputter targets of maximal size (planar area) can be provided, and any one of them can selectively be brought into the identical position for ion beam sputter deposition of material from said targets, using a target assembly having small spatial volume and simple design. An optional aspect of the invention is the ability to rotate each target pair about its mounting axis on the circumference of the mounting circle for the purpose of optimizing the ion beam incidence angle upon the target. Additionally, the target pairs can be water cooled.

The polar angle of ion beam incidence can be varied within ±20° by "wagging" or dithering the target normal with respect to the incident ion beam direction in order to defeat the formation of surface roughness and to improve deposition uniformity.

There are two distinct senses in which shielding of the sputter targets from chemical impurities, e.g., from sputtered-atom fluxes, is important. The first is the shielding of all of the targets from an external sputtered flux source, e.g., from a second ion beam sputtering the substrate. The second is the shielding of the inactive targets from sputtered flux from the active target. While both senses are important in the present claimed invention, the second will be emphasized.

BRIEF DESCRIPTION OF THE DRAWINGS

Preferred embodiments of the present invention will now be set forth in detail with reference to the drawings, in which.

DETAILED DESCRIPTION OF THE PREFERRED EMBODIMENTS

Figure 1:
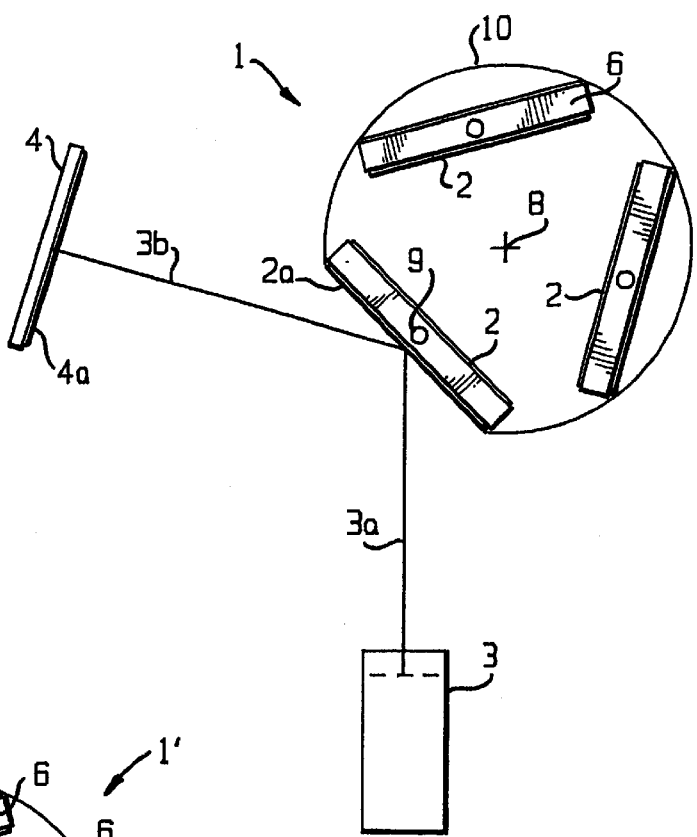
FIG. 1 shows an ion beam sputter deposition geometry implemented in the preferred embodiments of the present invention.

First, the ion beam sputter deposition geometry implemented in both preferred embodiments of the present invention will be described with reference to FIG. 1. Then, the individual embodiments and possible modifications thereto will be described with reference to FIGS. 2–7. Throughout the detailed description, like elements will be designated with like reference numerals, while elements that differ between the embodiments will be distinguished with prime marks (' or ").

Geometry

As shown in FIG. 1, a sputter target assembly 1 includes several sputter targets 2, which are arranged back-to-back on paddles 6. One of the targets 2 has been moved in a manner to be described below into an operating position for use as the desired target 2a. A sputtering ion beam source 3 irradiates the desired target 2a with an ion beam 3a to generate an atom flux 3b from the material on the desired target 2a. The resulting sputtered atom flux 3b is collected on a substrate 4, and a film 4a is grown on the substrate 4.

Any one of the multiple sputter targets 2 can be moved into position as the desired target 2a in the following manner. The paddles 6 are mounted so as to be rotatable about their common axis 8. The paddles 6 are rotated so that the paddle 6 that carries the desired target 2a is brought into the position. If the desired target 2a is facing outward, so that it is in the path of the ion beam 3a, nothing further need be done. If, on the other hand, the desired target 2a is facing inward, the paddle 6 is rotated about its own axis 9 so that the desired target 2a faces outward. Through that simple two-step process, any of the targets 2 can be brought into position.

First Preferred Embodiment

Figure 2:
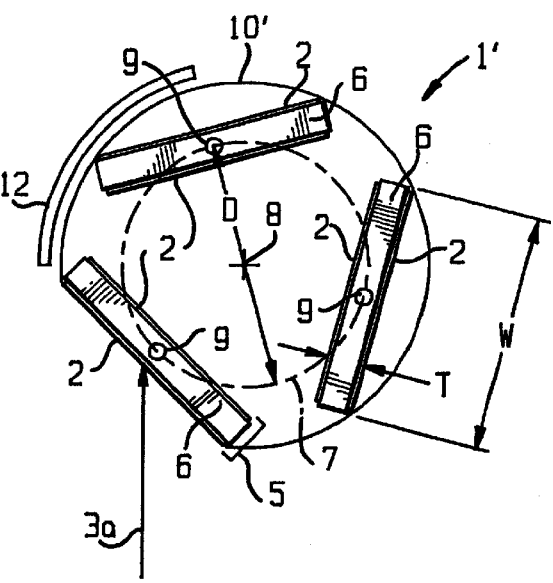
FIG. 2 shows a first preferred embodiment of the invention.

The first preferred embodiment of the ion beam sputtering target assembly 1' having six sputter targets 2 is shown in FIG. 2. The sputter targets 2 are arrayed in pairs 5, and each pair of targets is mounted back-to-back upon a substantially planar target mounting plate or paddle 6. Each of the three paddles 6, with its two targets 2, is disposed upon the circumference of a circular holder or bracket 7, equally spaced. Together, the two planar sputter targets, back-to-back, and the mounting plate form an essentially flat, planar structure a few centimeters in thickness.

The circular holder or bracket 7 supporting those target pairs 5 can be rotated about its axis 8 in such a way as to bring any one of the target pairs 5 to be exposed to the sputtering ion beam 3a so as to deposit a film 4a on a substrate 4 (not shown in FIG. 2). The identity of the target exposed to the sputtering ion beam, within each pair 5 of targets, is selected by a rotation about the axis 9 of the paddle 6 holding the target pair 5. The axes 9 of the paddles 6 are located on the circumference of the circular holder or bracket 7.

six targets 2 are mounted in three back-to-back pairs 5 on the paddles 6, which are arrayed at 120° intervals around a circular holder or bracket 7. That arrangement allows the maximal surface area targets to be housed in the minimal target assembly volume.

The holder or bracket need not be circular in shape. An alternative holder or bracket 7a, shown in FIG. 4, has the shape of an equilateral triangle, with one paddle 6 disposed at each corner of the equilateral triangle. Other shapes, such as a simple arrangement of three spokes or a flat plate, can be used instead. Of course, if there are more or fewer than three paddles 6, the shape of the holder or bracket can be adapted accordingly.

The sputter targets themselves can have substantially flat sputter surfaces of various shapes, such as round, square, rectangular (various aspect ratios), hexagonal, octagonal, and so on. All shapes which will fit on the flat faces of the paddles 6 are useable.

The ratios of the width W and the thickness T of the paddles 6 and the diameter D of the holder 7 (or other corresponding dimension if the holder is not circular) affect both the spatial efficiency of the overall target assembly and the sequence of movements necessary for operation of the assembly to bring each target into the active position. Only the maximum dimension or width W of the paddles 6 perpendicular to the rotation axes 8 and 9 is important in those mathematical ratios. The following two ratios are important:

a. W/D=1.235
b. W/T=8.19

It will be evident that variations around those design ratios are possible without departing from the concept of the present invention (e.g., W>D, W/T>6). In particular, if thinner target mounting plates 6 are used, then the ratio W/T can be quite a bit larger. It will also be appreciated that, if the ratio W/T is made larger than specified above, then the ratio W/D can also be made somewhat larger, giving an even greater volume utilization efficiency.

Another detail of the present invention concerns shielding of the targets not currently being sputtered. It is generally true that a small fraction of the sputtered atoms from the target currently being used can bounce several times from the substrate and incidental internal surfaces of the sputter coater and can thus end up being deposited in or on the target assembly. Such an unintended deposition would contaminate the surface of the other sputter targets with atoms from the currently active target. Therefore, the target assembly can be enclosed with a close-fitting shield or shroud to intercept those contaminating sputtered atoms and prevent them from depositing on other targets. In both FIG. 1 and FIG. 2, the shield or shroud 10, 10' closely resembles the shape and location of the shield for the target assembly. It can be fabricated from a convenient material such as stainless steel sheet metal.

Figure 6:
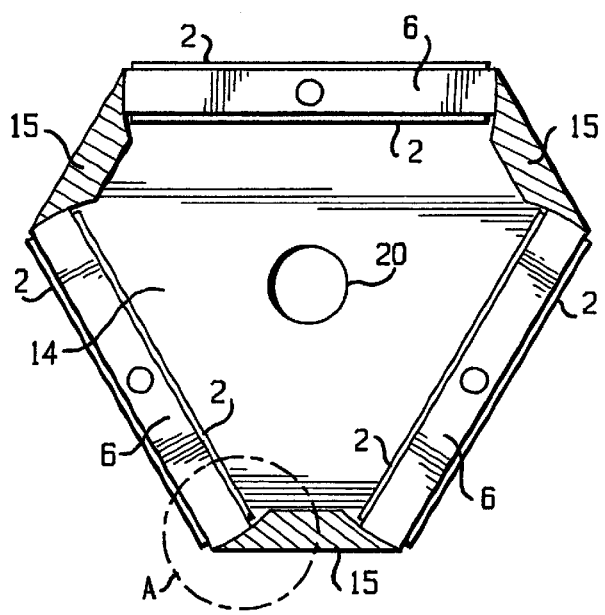
FIG. 6 shows a cross-sectional view of the bracket and paddles of FIG. 5.
Figure 7:
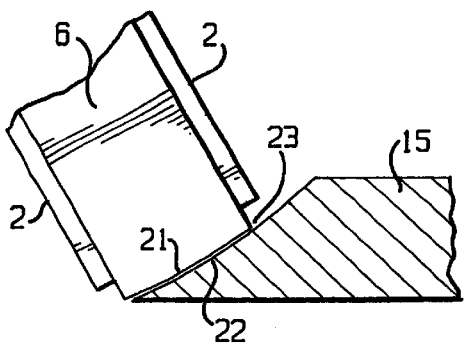
FIG. 7 shows an enlarged view of a portion of FIG. 6.
Figure 5:
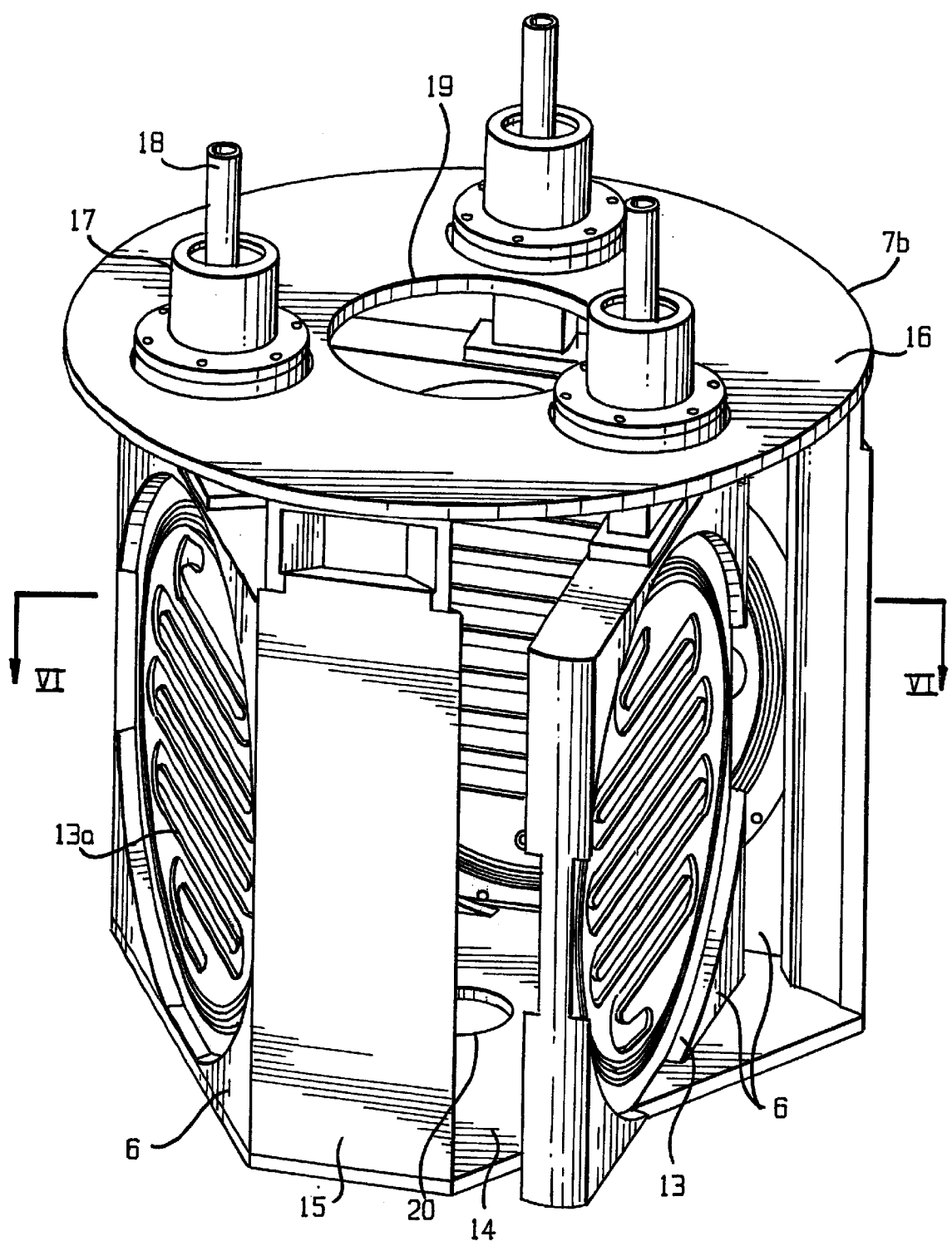
FIG. 5 shows a detailed perspective view of a bracket and paddles usable in either of the preferred embodiments of the invention.

Additional shielding can be provided by using a bracket or holder 7b shown in FIGS. 5–7, which is usable in either the first or the second preferred embodiment or in other embodiments. The holder 7b holds three paddles 6, each of which has recesses 13 for holding targets (not shown in FIG. 5) and water grooves 13a for conveying a cooling fluid such as water. The bracket 7b includes a lower plate 14, three uprights 15, and an upper plate 16. The upper plate 16 supports housings 17 which enclose motors for turning the shafts 18 of the paddles 6. Each shaft 18 extends from is housing 17 and includes a feedthrough for providing water to the grooves 13a. The holder 7b can be turned with a suitable stepping motor or other turning device engaging with holes 19, 20.

FIG. 6 shows a cross-sectional view taken along lines VI—VI in FIG. 5. FIG. 7 shows an enlargement of the portion of FIG. 5 enclosed within the dashed circle A. Each paddle 6 has curved surfaces 21 mating with corresponding curved surfaces 22 in the uprights 15. The curved surfaces 21, 22 are spaced just far enough apart to allow each paddle 6 to turn, and they have the appropriate radii of curvature to allow such turning. Thus, a narrow, curved gap 23 is provided, which prevents material sputtered outside the target assembly from penetrating through the gaps 23 and thereby prevents contamination of those of the targets 2 which are facing inward.

Yet another detail of the invention concerns shielding of all the targets in the target assembly 1 when no target is in use. Optionally, a shutter can be incorporated which, when closed, covers the target which would be exposed to the sputtering ion beam if the shutter were open. It is sometimes desirable to close the target shutter, e.g., in the case that a second, optional ion beam source is directed at the deposition substrate in order to sputter-clean the surface of the substrate prior to deposition of coatings on the substrate. In that case, some of the sputtered atoms from the substrate could be deposited on exposed target, if the target shutter were not closed. That would contaminate the surface of the sputter target with atoms from the substrate. Therefore, a movable shutter 12 can be provided for the exposed target of the target assembly.

The target assembly employs the following mode of operation, that is, sequencing of its moving parts:

1) A "home" position is established, with all of the target paddles 6 tangential to their circle of rotation along the holder 7, as shown in FIG. 2.

2) The entire assembly of three paddles 6 is rotated on the holder 7 about the common axis 8 to bring the desired paddle 6 to the active sputtering position.

3) The selected paddle 6 is rotated about its own axis 9 to bring the desired target 2a of the pair 5 of targets on that paddle 6 to the active sputtering position.

4) Continued combinations of those two basic movements can be repeated to bring any particular target 2 into the active sputtering position.

Measurements will now be provided for one assembly constructed as shown in FIG. 2. The targets 2 are round disks with a diameter of 16 inches (406.4 mm) and a thickness of 0.25 inches (6.35 mm). The width W of each paddle 6 in the direction perpendicular to the axes 8 and 9 is 16.38 inches (415.9 mm), and the thickness T is 2.38 inches (60.3 mm), including the thickness of the targets. That thickness of each paddle 6 allows it to be cooled internally by flowing water. The targets 2 are bonded to each paddle 6 by metallurgical techniques well known in the commercial art. The diameter of the circular holder 7 is 14.5 inches. That gives a ratio W/D=1.129, which smaller than the optimal value of 1.235 but still well within the range of the concept of the present invention. The same is true of the ratio W/T, which is 6.89 rather than 8.19. Such minor adjustments to the design ratios are made to accommodate detailed testing of the prototype. The constructed assembly also includes both a close-fitting shield 10' for the targets not in active use and a movable shutter 12 to cover the target at the active position in the case that no target is in use and other operations are going on in the deposition chamber.

Second Preferred Embodiment

Figure 3:
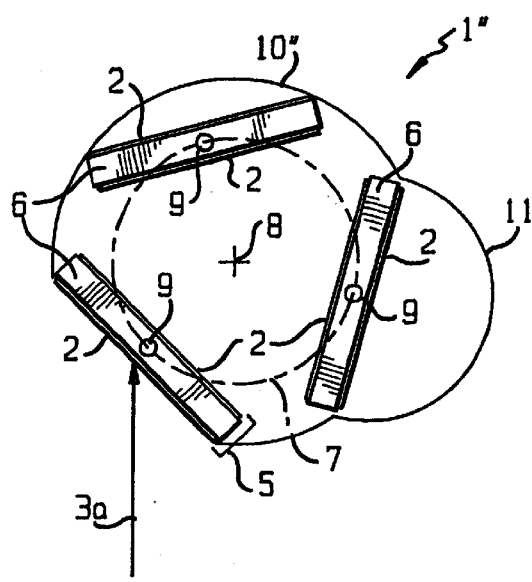
FIG. 3 shows a second preferred embodiment of the invention.
Figure 4:
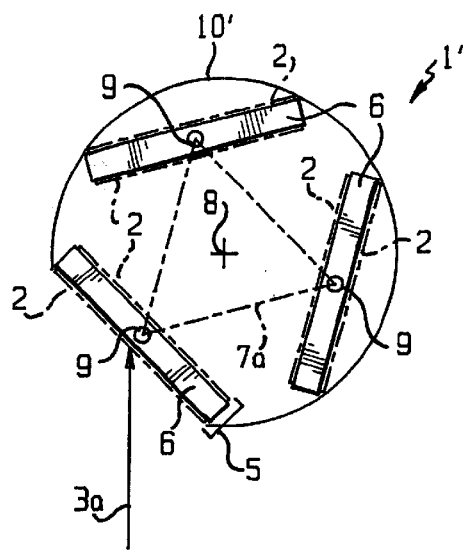
FIG. 4 shows an alternative bracket that can be used in either of the preferred embodiments of the invention.

FIG. 3 shows an assembly 1" according to a second preferred embodiment of the present invention. The second preferred embodiment will be described primarily in terms of its differences from the first preferred embodiment. Features disclosed above for the first preferred embodiment, including any modifications and particularly including the modification shown in FIG. 4, can be incorporated into the second preferred embodiment.

The protective shield 10" enclosing the target assembly 1" is enlarged at a region 11 to allow one of the target paddles 6 to be rotated about its axis 9 while at one of the inactive, non-sputtering rotary positions. Therefore, whichever of the two targets 2 on a paddle 6 is rotated to face outward (away from axis 8) while the paddle is in region 11 will face the sputtering ion beam when its paddle is moved to the active position and will thus serve as the desired target 2a. The second preferred embodiment can be desirable if, for example, a physical obstruction prohibits paddle rotation at the active sputtering position. In the second preferred embodiment, the operating sequence of the target assembly is as follows:

1) A "home" position is established, with all of the target paddles 6 tangential to their circle of rotation along the holder 7, as shown in FIG. 3.

2) The entire assembly of three target paddles 6 is rotated about the common axis 8 to bring the desired paddle to the region 11 where the enlarged shield permits paddle rotation.

3) The paddle 6 in the region 11 is rotated about its own axis 9 to bring the desired target 2 of that pair to the outward-facing (away from axis 8) orientation.

4) The entire assembly of three target paddles 6 is rotated about the common axis 8 to bring the desired target pair and the outward-facing target to the active sputtering position as the desired target 2a.

5) Continued combinations of those two kinds of basic movements can be repeated to bring any particular target 2 into the active sputtering position to serve as the desired target 2a.

In the first and second preferred embodiments, the appropriate sources of motive power for the various moving parts of the assembly, such as the holder 7, will be readily apparent to those skilled in the art who have reviewed the present disclosure.

WORKING EXAMPLES

The following examples are provided to illustrate the manner in which the present invention is used. These examples are illustrative and not limiting.

Example 1

A common thin-film structure that may be produced using the present invention is Ta(5 nm)/NiFe(4 nm)/Co(1 nm)/Cu(3 nm)/Co(2.5 nm)/FeMn(15nm), which is commonly called a spin valve and is used in the manufacture of thin film heads. Assuming that a target of each of the materials listed above is affixed to one of the paddle sides (five targets total in this case with one left over as a "spare" or "blank"), the procedure for making this structure is as follows:

a) Allow the system to reach base vacuum.

b) Set process gas flows and pressures—roughly 10 sccm of Ar or Xe at $2 \times 10^{-4}$ Torr.

c) Rotate the first target (Ta) into position.

d) Open the target shutter.

e) Start the ion source and associated neutralization sources to begin sputtering the target.

f) Open the substrate shutter (if the system in question has such a shutter).

g) Close the substrate shutter after a period of time chosen to provide the desired film thickness for the target material. Typically, this time is determined from an earlier calibration of the process on samples made for this purpose.

h) Turn off the ion source and/or close the target shutter.

i) Repeat (a) through (f) for each layer in the structure until complete. The Co target will be sputtered twice during the course of this process.

Typical results achieved include magnetoresistance ratios in excess of 7%, uniformity over an 8" diameter of less than 2%, and run-to-run reproducibility of less than 2%.

Example 2

Another common thin-film structure that may be produced using the present invention is Cr(5 nm)/CoCrPt(20 mn)/Au(100 nm)/Ta(10 nm), which is commonly used in the manufacture of thin film heads. Assuming that a target of each of the materials listed above is affixed to one of the paddle sides (four targets total in this case with two left over as "spares" or "blanks"), the procedure for making this structure is as follows:

a) Allow the system to reach base vacuum.

b) Set process gas flows and pressures—roughly 10 sccm of Ar or Xe at $2 \times 10^{-4}$ Torr.

c) Rotate the first target (Cr) into position.

d) Open the target shutter.

e) Start the ion source to begin sputtering the target.

f) Open the substrate shutter (if the system in question has such a shutter).

g) Close the substrate shutter after a period of time chosen to provide the desired film thickness for the target material. Typically, this time is determined from an earlier calibration of the process on samples made for this purpose.

h) Turn off the ion source and/or close the target shutter.

i) Repeat steps (a) through (f) for each layer in the structure until complete.

Typical results achieved include coercivities of the CoCrPt in excess of 1500 Oe, low resistivity Au, uniformity over an 8" diameter of less than 2%, and run-to-run reproducibility of less than 2%.

Further details of the construction and operation of a device according to the present invention will now be provided. These details should be construed as illustrative rather than limiting, since those skilled in the art who have reviewed the present disclosure will readily appreciate that a working device within the scope of the present invention can be made in many other ways.

The paddles are moved by servo motors. The servo motors drive a reduction gear box that is coupled to the paddle shafts with a simple belt drive, much like the belts in a car. Another possible coupling mechanism is gears. These motors and gearboxes are attached to the bracket and rotate with it as different paddles are selected. The bracket also contains rotary vacuum feedthroughs to allow the paddles to turn.

The paddle motors, gearboxes, and the like are enclosed by an inner housing that mounts on top of the bracket and attaches to its outside rim. This housing is itself terminated in a large, rotary, hollow, vacuum feedthrough, which is connected to yet another, outer housing that mounts on the vacuum chamber. The inner housing is coupled to an indexing motor via the rotary feedthrough, and this motor drives the positioning of the bracket. This interior of the inner housing remains at atmospheric pressure during the operation of the devices. The exterior of the inner housing and the interior of the outer housing become a part of the vacuum vessel of the system.

Water enters the inner housing via tubing running through the hollow center of the rotary feedthrough connecting the inner and outer housings. It then enters a two-channel rotary water union mounted directly above the paddle shaft. Water flows through the union, through the hollow shaft of the paddle's rotary feedthrough, and into the water grooves cut into the target paddle mounts. When a target is mounted, the water is sealed against vacuum by o-rings and makes intimate contact with a copper backing plate to which the target is bonded. The water exits the paddle by passing again through the paddle's rotary feedthrough and the water union. On exiting the water union it is routed to another water union (placing all the targets in series) until it exits (as it entered) the inner housing by means of tubing running through the upper feedthrough connecting the inner and outer housings. It is possible to forgo the use of the rotary water unions if sufficiently flexible and durable water lines can be found that attach directly to the paddle. The risk with this design is that the constantly motion of the paddles will cause the water lines to fail.

The wagging or dithering of the target is accomplished using the same servo motors that rotate a paddle from one side to another. In the case of dithering, the target is rotated periodically over a small range of angles, e.g., about $\pm 10°$ about its home position. This dithering improves the uniformity of the deposited films by "steering" the plume of sputtered material and reduces the effects of target texturing. In addition to dithering, the design allows a simple static adjustment of the target angle by allowing offsets in the paddle angle with respect to the home position (about $\pm 20°$). If the target offset or dithering angles become too large, then the targets facing the interior of the assembly may become contaminated.

While two preferred embodiments and various modifications thereof have been set forth in detail above, many other embodiments can be realized within the scope of the present claimed invention. For example, the paddles can be replaced with prism members with three or more sides for holding the targets. Also, the paddles or prism members can be moved into and out of position linearly or in any other suitable way. Therefore, the invention should be construed as limited only by the appended claims.

I claim:

1. A target assembly for sputtering, the target assembly comprising:

a plurality of target holding members, each of the plurality of target holding members having a plurality of target holding sides and being rotatable about an individual axis;

a sputtering target disposed on each of the target holding sides of each of the target holding members; and holding means for holding the plurality of target holding members, for being moved to bring a desired one of the plurality of target holding members into a sputtering position, and for allowing the desired one of the plurality of target holding members to be rotated about its individual axis while the holding means is not moved, so as to bring one of the plurality of target holding sides of the target holding member into the sputtering position;

wherein each of the plurality of target holding members is formed as a paddle and has two of said target holding sides;

wherein the holding means comprises a bracket for being rotated about a common axis which is different from the individual axis of any of the plurality of target holding members so as to bring the desired one of the plurality of target holding members into the sputtering position;

wherein each of the target holding sides has a width W; wherein the bracket has a diameter D; and wherein W>D.

2. A target assembly as in claim 1, wherein each of the paddles has a thickness T; and wherein W/T>6.

3. A target assembly as in claim 1, further comprising a shield for shielding all of the plurality of target holding members except the desired one of the plurality of target holding members when the desired one of the plurality of target holding members is in the sputtering position.

4. A target assembly as in claim 3, further comprising a shutter for being movable in and out of the sputtering position to shield all of the plurality of target holding members.

5. A target assembly as in claim 3, wherein the shield comprises an enlarged region for permitting one of the target holding members disposed at the enlarged region to rotate about the individual axis of said one of the target holding members within the enlarged region.

6. A target assembly for sputtering, the target assembly comprising:
- a plurality of target holding members, each of the plurality of target holding members having a plurality of target holding sides and being rotatable about an individual axis;
- a sputtering target disposed on each of the target holding sides of each of the target holding members; and
- holding means for holding the plurality of target holding members, for being moved to bring a desired one of the plurality of target holding members into a sputtering position, and for allowing the desired one of the plurality of target holding members to be rotated about its individual axis while the holding means is not moved, so as to bring one of the plurality of target holding sides of the target holding member into the sputtering position; wherein:
- each of the plurality of target holding members has curved surfaces separating adjacent ones of the target holding sides; and
- the holding means comprises a plurality of uprights, each disposed between adjacent ones of the target holding members and having curved surfaces mating with the curved surfaces of the adjacent ones of the target holding members to form narrow gaps.

7. A method of positioning a desired sputtering target into a sputtering position, the desired sputtering target being selected from among a plurality of sputtering targets, the method comprising:
- (a) providing a plurality of target holding members, each of the plurality of target holding members having a plurality of target holding sides and being rotatable about an individual axis, one of the plurality of sputtering targets disposed on each of the target holding sides of each of the target holding members;
- (b) bringing a desired one of the plurality of target holding members which bears the desired sputtering target into the sputtering position; and
- (c) rotating the desired one of the plurality of target holding members about its individual axis while step (b) is not being carried out so as to bring the desired sputtering target into the sputtering position;
- wherein each of the plurality of target holding members is formed as a paddle and has two of said target holding sides;
- wherein step (b) comprises:
  - (i) providing a bracket on which the plurality of target holding members are disposed; and
  - (ii) rotating the bracket about a common axis which is different from the individual axis of any of the plurality of target holding members so as to bring the desired one of the plurality of target holding members into the sputtering position;
- wherein each of the target holding sides has a width W; wherein the bracket has a diameter D; and wherein W>D.

8. A method as in claim 7, wherein each of the paddles has a thickness T; and wherein W/T>6.

9. A method as in claim 7, further comprising providing a shield for shielding all of the plurality of target holding members except the desired one of the plurality of target holding members when the desired one of the plurality of target holding members is in the sputtering position.

10. A method as in claim 9, further comprising:
providing a shutter; and
moving the shutter in and out of the sputtering position to shield all of the plurality of target holding members.

11. A method as in claim 9, wherein:
the shield comprises an enlarged region; and
the method further comprises rotating one of the target holding members disposed at the enlarged region about the individual axis of said one of the target holding members within the enlarged region.

12. A method of positioning a desired sputtering target into a sputtering position, the desired sputtering target being selected from among a plurality of sputtering targets, the method comprising:
- (a) providing a plurality of target holding members, each of the plurality of target holding members having a plurality of target holding sides and being rotatable about an individual axis, one of the plurality of sputtering targets disposed on each of the target holding sides of each of the target holding members;
- (b) bringing a desired one of the plurality of target holding members which bears the desired sputtering target into the sputtering position; and
- (c) rotating the desired one of the plurality of target holding members about its individual axis while step (b) is not being carried out so as to bring the desired sputtering target into the sputtering position; wherein:
- each of the plurality of target holding members has curved surfaces separating adjacent ones of the target holding sides; and
- the method further comprises providing a plurality of uprights, each disposed between adjacent ones of the target holding members and having curved surfaces mating with the curved surfaces of the adjacent ones of the target holding members to form narrow gaps.

13. A target assembly for sputtering, the target assembly comprising:
- a plurality of target holding members, each of the plurality of target holding members having a plurality of target holding sides and being rotatable about an individual axis;
- a sputtering target disposed on each of the target holding sides of each of the target holding members; and
- holding means for holding the plurality of target holding members, for being moved to bring a desired one of the plurality of target holding members into a sputtering position, and for allowing the desired one of the plurality of target holding members to be rotated about its individual axis while the holding means is not moved, so as to bring one of the plurality of target holding sides of the target holding member into the sputtering position; wherein the holding means comprises a plurality of motors, each for turning one of the plurality of target holding members.

14. A target assembly for sputtering, the target assembly comprising:
- a plurality of target holding members, each of the plurality of target holding members having a plurality of target holding sides and being rotatable about an individual axis;
- a sputtering target disposed on each of the target holding sides of each of the target holding members; and holding means for holding the plurality of target holding members, for being moved to bring a desired one of the plurality of target holding members into a sputtering position, and for allowing the desired one of the plurality of target holding members to be rotated about its individual axis while the holding means is not moved, so as to bring one of the plurality of target holding sides of the target holding member into the sputtering position; wherein:

each of the plurality of target holding members is formed as a paddle and has two of said target holding sides; each said paddle is rectangular; each said target is round;

each of the plurality of paddles has curved surfaces separating adjacent ones of the target holding sides; and the holding means comprises a plurality of uprights, each disposed between adjacent ones of the target holding members and having curved surfaces mating with the curved surfaces of the adjacent ones of the target holding members to form narrow gaps.

* * * * *